United States Patent
Lee et al.

(10) Patent No.: US 7,178,081 B2
(45) Date of Patent: Feb. 13, 2007

(54) SIMPLIFIED MESSAGE-PASSING DECODER FOR LOW-DENSITY PARITY-CHECK CODES

(75) Inventors: Sang-Hyun Lee, Busan (KR); Yun-Hee Kim, Daejeon (KR); Kwang-Soon Kim, Daejeon (KR); Kyung-Hi Chang, Daejeon (KR)

(73) Assignee: Electronics and Telecommunications Research Institute (KR)

( * ) Notice: Subject to any disclaimer, the term of this patent is extended or adjusted under 35 U.S.C. 154(b) by 489 days.

(21) Appl. No.: 10/696,897

(22) Filed: Oct. 29, 2003

(65) Prior Publication Data

US 2004/0123230 A1 Jun. 24, 2004

(30) Foreign Application Priority Data

Dec. 24, 2002 (KR) ............................... 2002-83721

(51) Int. Cl.
*H03M 13/00* (2006.01)
(52) U.S. Cl. .................... 714/752; 714/801; 714/794; 375/265; 375/341
(58) Field of Classification Search ................ 714/752, 714/801, 794
See application file for complete search history.

(56) References Cited

U.S. PATENT DOCUMENTS

| | | | | |
|---|---|---|---|---|
| 6,633,856 B2* | 10/2003 | Richardson et al. | ........... | 706/15 |
| 6,938,196 B2* | 8/2005 | Richardson et al. | ........ | 714/752 |
| 7,013,116 B2* | 3/2006 | Ashikhmin et al. | ......... | 455/214 |

FOREIGN PATENT DOCUMENTS

| | | |
|---|---|---|
| KR | 1020020051549 | 6/2002 |
| KR | 1020020072628 | 9/2002 |
| WO | 01/43292 A1 | 6/2001 |

* cited by examiner

*Primary Examiner*—Guy Lamarre
*Assistant Examiner*—Esaw T. Abraham
(74) *Attorney, Agent, or Firm*—Blakely Sokoloff Taylor & Zafman

(57) ABSTRACT

Disclosed is an implementation method for simplifying a complicated message-passing function in a decoder for decoding block codes encoded with low-density parity-check (LDPC) codes and only using a summator and a shifter to simplify the hardware structure of the decoder, in which method the input interval of the message-passing function for binary representation of a message input is divided and the respective divided intervals are linearized to allow the calculation of the output of the message-passing function without using a memory. Based on the fact that the message-passing function is similar in structure to an exponential function, the linearized intervals are set to make the maximum value expressible in each digit of the binary representation as the boundary of the intervals.

10 Claims, 7 Drawing Sheets

$$\begin{bmatrix} 1 & 0 & 0 & 1 & 0 & 0 & 1 & 0 & 0 \\ 0 & 1 & 0 & 0 & 1 & 0 & 0 & 1 & 0 \\ 0 & 0 & 1 & 0 & 0 & 1 & 0 & 0 & 1 \\ 1 & 0 & 0 & 0 & 1 & 0 & 0 & 0 & 1 \\ 0 & 1 & 0 & 0 & 0 & 1 & 1 & 0 & 0 \\ 0 & 0 & 1 & \boxed{1} & 0 & 0 & \boxed{0} & 1 & 0 \end{bmatrix}$$

110  120  100

US 7,178,081 B2

SIMPLIFIED MESSAGE-PASSING DECODER FOR LOW-DENSITY PARITY-CHECK CODES

CROSS REFERENCE TO RELATED APPLICATION

This application claims priority to and the benefit of Korea Patent Application No. 2002-83721 filed on Dec. 24, 2002 in the Korean Intellectual Property Office, the content of which is incorporated herein by reference.

BACKGROUND OF THE INVENTION (a) Field of the Invention

The present invention relates to a decoding technology for channel codes. More particularly, the present invention relates to a message-passing decoder for LDPC (Low-Density Parity-Check) codes that receives data encoded with LDPC codes on a channel, having a consecutive output values, and decodes the coded data using a message-passing decoding algorithm.

(b) Description of the Related Art

LDPC codes are linear block codes reported by Gallager in 1962, and they are defined as a sparse parity-check matrix of which the elements are mostly "0". LDPC codes were out of the public's mind for a long time due to expense of implementation, but they were re-discovered by MacKay and Neal in 1995. In 1998, irregular LDPC codes derived from generalization of the LDPC codes proposed by Gallager were announced. At the time of the first announcement of the LDPC codes by Gallager, the probabilistic coding method for LDPC codes was also made known, through which method the excellent performance of LDPC codes was demonstrated. It was also found that LDPC codes have an improved performance when they are expanded from binary codes to nonbinary codes. Like Turbo codes, LDPC codes have a bit error rate (BER) approaching the channel capacity limit defined by Shannon. The irregular LDPC codes known to have the greatest performance are suitable for applications requiring a high-quality transmission environment having a considerably low BER, because they need no more than 0.13 dB in addition to the channel capacitor by Shannon in order to achieve a BER of $10^{-6}$ when the block size is about $10^6$ bits in the additive white Gaussian noise (AWGN) channel environment.

The basic decoding method for LDPC codes includes a probabilistic decoding algorithm, unlike the algebraic decoding algorithm that is the decoding method of the conventional block codes, and adapts a belief propagation method based on graph theory and probabilistic prediction theory. Accordingly, the LDPC decoder calculates, for individual bits of the code word received through the channel, the probability of the corresponding bit being "1" or "0". The probabilistic information calculated by the decoder is specifically called a "message", and is used in checking whether or not each parity defined in a parity-check matrix is satisfied. The message calculated when a specific parity of the parity-check matrix is satisfied, i.e., when the result of the parity check is "0", is specifically called a "parity-check message", which specifies the value of each bit of the code word. The parity-check message for each parity is used in determining the value of the corresponding bit. The information about the bit calculated is called a "bit message". In the procedure of repeating the message-passing operation, information about the bits of each code word is constantly improved until all the parities of the parity-check matrix are satisfied. If the parities of the parity-check matrix are all satisfied, the decoding of the code word is ended. Typically, systematic codes are used in a channel environment having a low signal-to-noise ratio (SNR), so a specific part of the code word is extracted to reproduce information bits. It is favorable to convert a probabilistic message to a log likelihood ratio (LLR) message for calculation so as to readily achieve message propagation decoding of LDPC binary codes in the AWGN channel environment.

This LLR message decoding method involves a logarithm function operation in message calculation, and it causes a problem in regard to implementation of a nonlinear function. Typically, in calculation of a nonlinear function for an integrated circuit, a specific value is stored in a read-only memory (ROM) and the output value of an address related to the input is read out from the ROM. The use of this method requires memories of a large capacity and increases the area cost of the integrated circuit, thereby raising the cost of implementation. But, reducing the number of bits representing input and output deteriorates the accuracy of the message calculation to reduce the entire decoding performance and increase the BER.

SUMMARY OF THE INVENTION

It is an advantage of the present invention to implement calculation of a parity-check message in a decoder for LDPC codes by applying a linear approximation method to individual intervals divided from an input interval without using a read-only memory (ROM). The parity-check function used for the calculation of the parity-check message is a monotonically decreasing function that shows a similar decreasing tendency to an exponential function, so the interval can be determined in the manner of the exponential function to drastically reduce approximation errors caused by linear approximation. For the linear approximation, the slope for each interval and the function value at the interval boundary are necessary. A simple multiplier is constructed with a combination of summators and shifters. Accordingly, the entire parity-check function can be calculated only with the operations of summators and shifters. The present invention proposes a decoder that implements the parity-check function in a simply way.

BRIEF DESCRIPTION OF THE DRAWINGS

The accompanying drawings, which are incorporated in and constitute a part of the specification, illustrate an embodiment of the invention, and, together with the description, serve to explain the principles of the invention.

DETAILED DESCRIPTION OF THE PREFERRED EMBODIMENTS

In the following detailed description, only the preferred embodiment of the invention has been shown and described, simply by way of illustration of the best mode contemplated by the inventor(s) of carrying out the invention. As will be realized, the invention is capable of modification in various obvious respects, all without departing from the invention. Accordingly, the drawings and description are to be regarded as illustrative in nature, and not restrictive.

The present invention can be applied to decoding of block codes encoded using LDPC codes. The block codes are encoded by way of a sparse parity-check matrix 100 designed to have the least number of elements 110 other than "0" 120, and a related generator matrix. The coding method is exactly the same as the coding of general block codes.

Figures 1, 2:
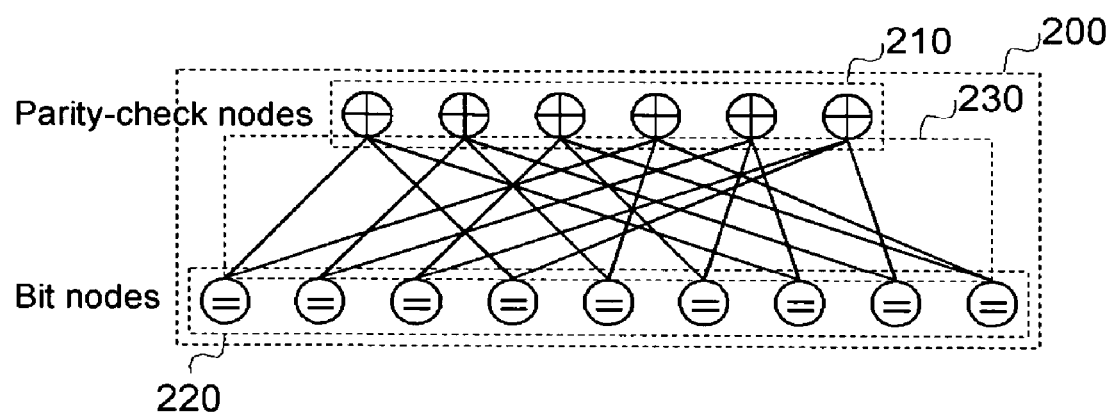
FIG. 1 is an illustration of a sparse parity-check matrix constituting one LDPC code.
FIG. 2 is a Tanner graph representing FIG. 1.
Figure 3:
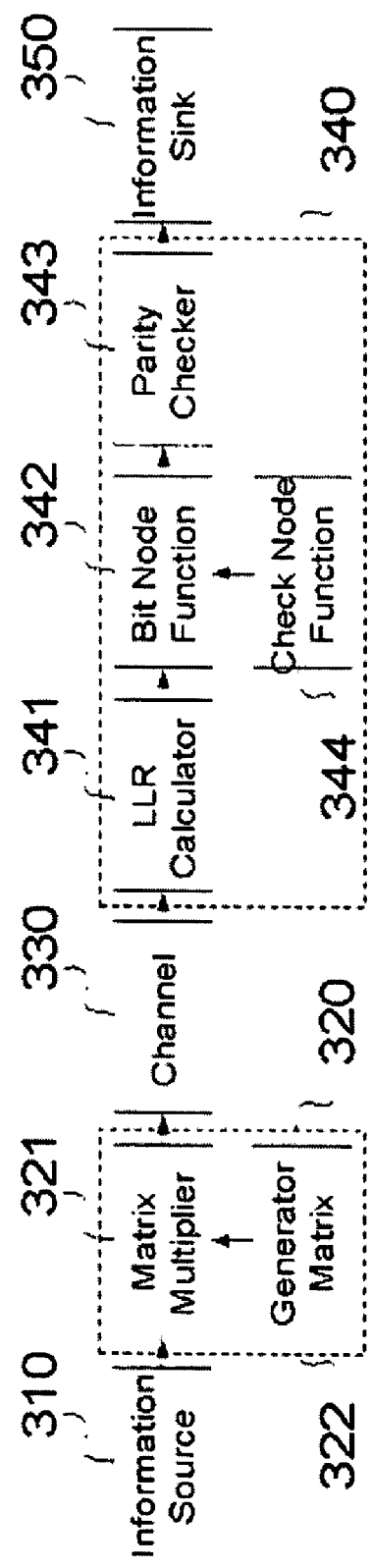
FIG. 3 is an illustration of an encoder and a decoder for LDPC codes.

In the decoding method of LDPC codes, a Tanner graph 220 is defined from the sparse parity-check matrix 100, and the message-passing algorithm is applied to the corresponding graph. FIG. 2 shows the Tanner graph for the parity-check matrix of FIG. 1. The Tanner graph 200 comprises nodes 210 and 220, and a branch 230. The nodes are divided into parity-check nodes 210 for a parity-check message, and bit nodes 220 for a bit message. The number of parity-check nodes 210 is equal to that of columns in the parity-check matrix 100. The number of bit nodes 220 is equal to that of rows in the parity-check matrix 100. The nodes represent the rows and columns of the matrix in sequence. The branch 230 contains elements having a non-zero value in the parity-check matrix 100. For example, the leftmost branch of FIG. 2 connecting the first parity-check node to the first bit node represents the element (1,1) of the parity-check matrix. Likewise, the branch connecting the first bit node to the fourth parity-check node represents the element (4,1) of the party-check matrix. The coding and decoding process is performed using the above-defined Tanner graph 200. FIG. 3 shows a coder 320 and a decoder 340. The decoder 340 comprises an LLR calculator 341, a bit node function unit 342, a check node function unit 344, and a parity checker 343. Assuming that each bit of a code word passing through a channel 330 is $y_i$ and the probability of the corresponding bit being "1" is $p_i$, the LLR calculator 341 calculates the LLR according to the following equation 1.

$$LLR(p_i) = \frac{2}{\sigma^2} y_i \qquad \text{Equation 1}$$

where $\sigma^2$ represents the noise power of the channel. The noise power of the channel is given as an externally input parameter.

Figure 4:
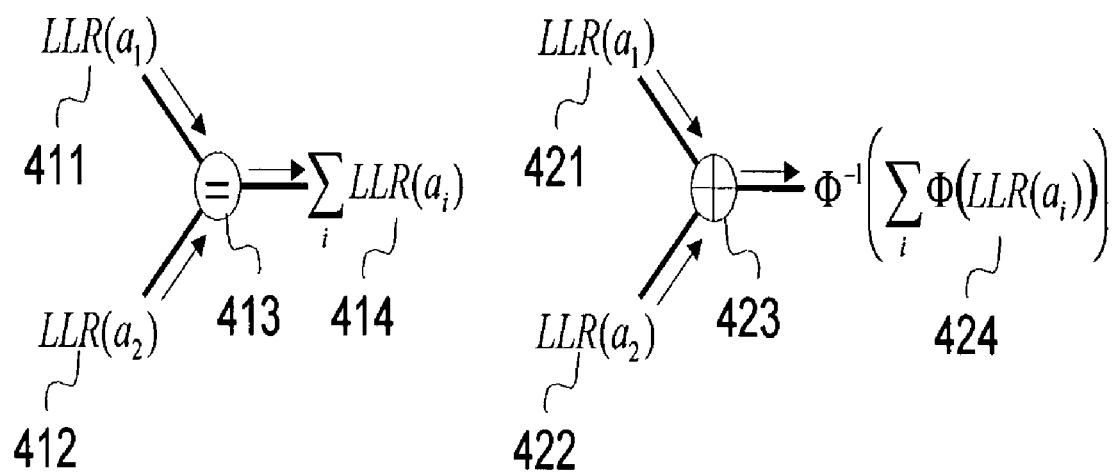
FIG. 4 is an illustration of a method for calculating a message in each node.

The message of each node can be determined using the initial LLR value. The calculation method for the message of bit nodes and parity-check nodes is illustrated in FIG. 4. First, a bit node message 414 is calculated using the initial LLR value given by the equation 1. The bit node function unit 342 calculates the LLR $q_{ij}$ of the message 414 of bit node 413 corresponding to the j-th parity of the i-th bit according to the following equation 2.

$$LLR(q_{ij}) \leftarrow \sum_{\substack{j' \in Col[i] \\ j' \neq j}} LLR(r_{ij'}) + LLR(p_i) \qquad \text{Equation 2}$$

The method of the check node function unit 344 calculating the LLR $r_{ij}$ of the message 424 of the parity-check node 423 is given by the following equation 3.

$$LLR(r_{ij}) \leftarrow \Phi^{-1}\left(\sum_{\substack{i' \in Col[j] \\ i' \neq i}} \Phi(LLR(q_{i'j}))\right) \qquad \text{Equation 3}$$

To calculate the parity-check message according to the equation 3, the mathematical function as defined by the equation 4 is necessary.

$$\Phi(x) = -\log\left(\tanh\left(\frac{|x|}{2}\right)\right) \qquad \text{Equation 4}$$

The parity-check message derived from the equation 3 is transferred to the bit node function unit 342. The bit node function unit 342 calculates the bit message using the updated parity-check message and the initial bit message, and transfers a new bit message to the check node function unit. This operation is repeated a predetermined number of times to obtain the final parity-check message. The bit node function unit 342 calculates the LLR of the information bit of each code word through the final parity-check message according to the following equation 5. The value of the corresponding bit is then determined from the LLR.

$$LLR(q_i) \leftarrow \sum_{j' \in Col[i]} LLR(r_{ij'}) + LLR(p_i) \quad \hat{u}_i = \begin{cases} 1 & LLR(q_i) > 0 \\ 0 & LLR(q_i) < 0 \end{cases} \qquad \text{Equation 5}$$

Once all the bit values of the code word are determined, a new code word is constructed using the bit values and is fed into the parity checker 343. The parity checker 343 calculates a syndrome for the code word to perform a parity check. With a non-zero syndrome for the code word, the parity checker 343 determines that the decoding of the code word is a failure. If the parity check is successful, the information bit part is extracted from the code word and transferred.

To implement the above-stated decoding algorithm in hardware, the respective message calculators 341, 342, and 344 have to receive soft decision inputs. The LLR calculator 341 receives a soft decision input and calculates the LLR of the soft decision output. The output of the LLR calculator 341 is a soft decision output, so the bit node function unit 342 needs a summator for summating soft decision inputs according to the equations 2 and 5. The output of the bit node function unit is also a soft decision output, so the check node function unit 344 must receive a soft decision input and the function of the equation 4 receives the soft decision input and generates a soft decision output.

The equation 4, which is not a linear function, cannot be implemented with the basic calculation blocks in hardware. To solve this problem, the function of the equation 4 can employ a ROM that receives as many inputs as the number of bits representing the soft decision input and generates as many outputs as the number of bits representing the soft decision output. Accordingly, the implementation cost of the check node function unit is greatly dependent upon the size of the ROM that is determined by the resolution of representing soft decision input and soft decision output.

The present invention proposes a check node function unit not using the ROM. For this purpose, the function of the equation 4 is implemented with basic calculation blocks. The basic calculation blocks include multipliers and summators. The multipliers are considerably high in price relative to the summators, and not preferably used in the present invention. Hence, powers of n for the soft decision input cannot be used, and only the linear function can be implemented. For that reason, the function of the equation 4 is divided into intervals, and the value of the linear approximation function for each interval is then calculated to determine the check node function unit 424. The inverse function of the equation 4 is necessary for the calculation of the check node function unit 424. The inverse function of the equation 4 is the same as the equation 4, so the input of the calculator of the equation 4 must be equal in the number of bits to the output.

Figure 5:
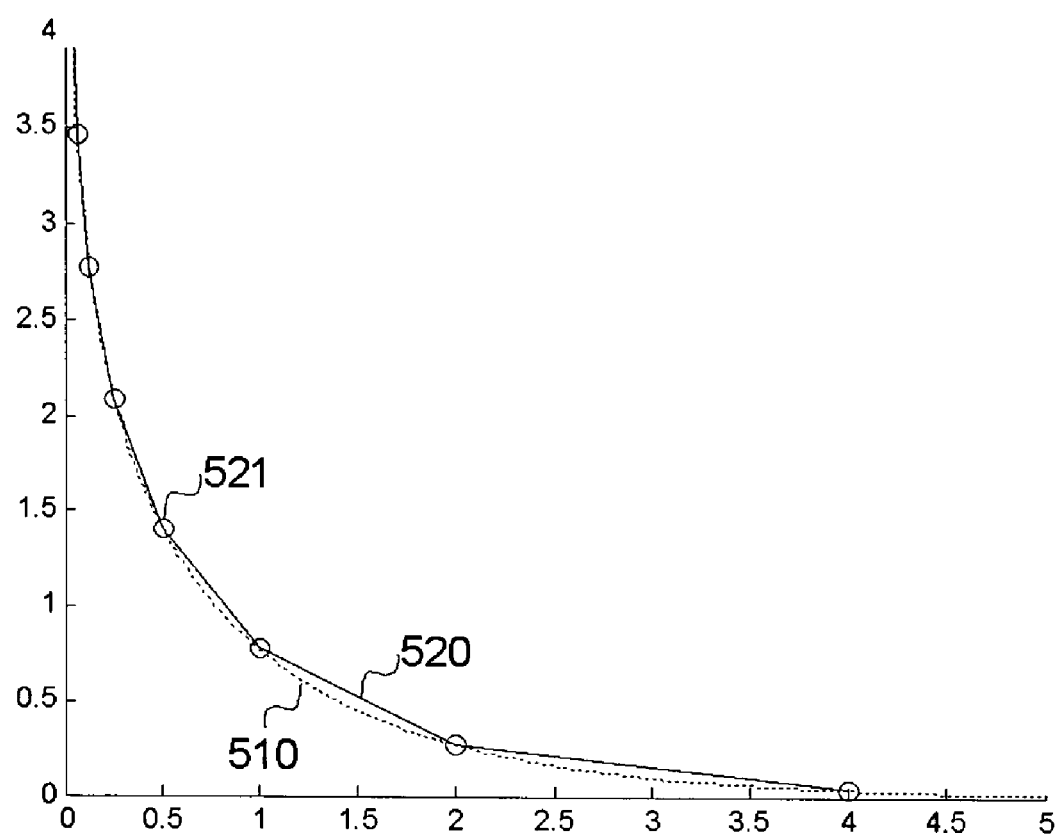
FIG. 5 shows a linearization method of a message-passing function.

The present invention proposes an interval division method as illustrated in FIG. 5 for the linear approximation of the equation 4. The actual function 510 of the equation 4 defines only the positive values because it has an absolute value as an input. So, the function 510 of the equation 4 is a monotonically decreasing function that decreases with the same slope of the exponential function. The interval for the linear approximation $I_i$ is divided as expressed in the following equation 6 so as to have an exponential size. In the equation 6, $n_1$ is the length of a word expressing the input value, i.e., the word length; and $n_2$ is the bit corresponding to the minimum resolution of decimal places expressing the input value. The minimum resolution that can be expressed by $n_2$ is $2^{-n_2}$.

Equation 6

$$I_i = \lfloor 2^{K+i}, 2^{K+1+i} \rfloor, i \in \{0, \ldots, n_1-1\}, K=-n_2$$

The accurate function value of the equation 4 for both boundary values of each interval $I_i$ is necessary. The coordinates for both end points of the interval are given, so the linear approximation equation can be defined by the following equation 7.

Equation 7

$$y = s_i \gamma + x_i, i \in \{0, \ldots, |\{I_i\}|-1\}, r \in I_i$$

From the equation 7, slope $s_i$ and interval boundary value $x_i$ are defined for each interval. First, the slope $s_i$ is defined as the following equation 8.

$$s_i = \mathrm{ROUND}\left(\frac{\Phi(2^{K+n_1-i-1}) - \Phi(2^{K+n_1-i})}{2^{K+n_1-i-1} - 2^{K+n_1-i}}, n_2\right), \quad i \geq 0 \qquad \text{Equation 8}$$

The ROUND function of the equation 8 is a function for designating an input as the most approximate one of the binary numbers given by $2^{-n_2}$ as the minimum resolution. The ROUND function is given by the following equation 9.

$$\mathrm{ROUND}(x, n_2) = 2^{-n_2}\left\lfloor \frac{x}{2^{-n_2}} + \frac{1}{2} \right\rfloor \qquad \text{Equation 9}$$

The boundary value $x_i$ is derived from the slope $s_i$ and $x_{i-1}$ as in the following equation 10.

Equation 10

$$x_i = \mathrm{ROUND}((2^{K+n_1-1} - 2^{K+n_1-i+1})s_i + x_{i-1}, n_2), i \geq 1,$$

$$x_0 = \mathrm{ROUND}(\Phi(2^{K+n_1}), n_2)$$

Figure 6:
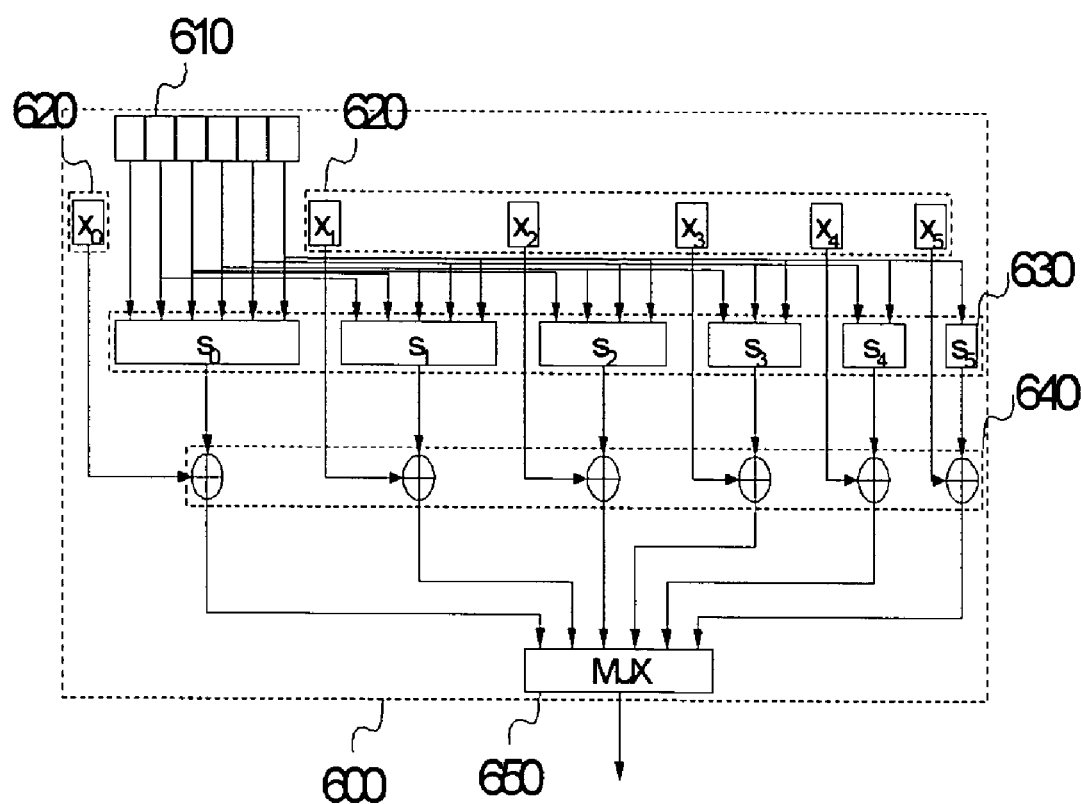
FIG. 6 shows a parallel implementation structure of a message calculator for calculating the linearized message-passing function as proposed in the present invention.

FIG. 6 illustrates a circuit 600 for calculating the function value of the equation 4 using the slope and the boundary value given by the equations 8 and 10, respectively. The soft decision inputs are all positive real values, so an input memory 610 inverts the sign of the negative (−) numbers. Namely, when the value of the most significant bit (MSB) is "1", the memory value of the input memory 610 is increased by one and the input memory 610 performs a 1's complement operation. The value of the input memory 610 is multiplied by the slope $s_i$ of each interval at a multiplier 630, and is added to the interval boundary value generated from a boundary value memory 620 by an adder 640 to determine the function value of the equation 4. Finally, to investigate the interval range of the input value in the input memory 610, a multiplexor (MUX) 650 for selecting the on/off state of a switch according to the MSB selects an accurate function value and outputs the selected function value. The multiplexor 650 outputs the first calculated value when the bit of the highest order other than 0 in the input memory is the first bit, or the second calculated value when the bit of the highest order other than 0 is the second bit. In this manner, the on/off state of the switch for every bit can be determined.

The unsolved problem in the above-stated method is the use of multipliers. Typically, the binary multiplier can be implemented with bit shifters and summators. Namely, for multiplication by 1.5, the input word is shifted to the right side by one bit for multiplication by 0.5 which is then added to itself to result in a binary number, which has a 1.5-fold value of the input word. In the same way, the bits of the input word are shifted to achieve a multiplication by 2. The slope is rounded off to a binary number from the equation 8 and the input word is a binary number, so the multiplier can be replaced with a summator and a shifter. Because the number of slopes is limited, summators and shifters are preferably used instead of a general-purpose multiplier in the aspect of curtailment of hardware expenses.

Figure 7:
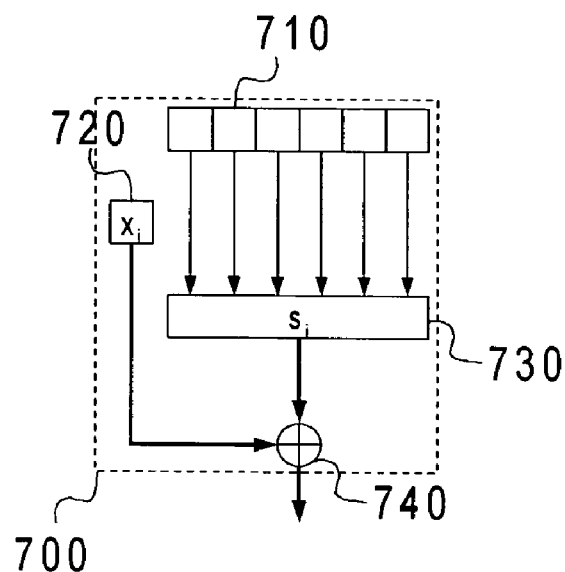
FIG. 7 shows an implementation structure of the minimum cost of the message calculator for calculating the linarized message-passing function as proposed in the present invention.
Figure 8:
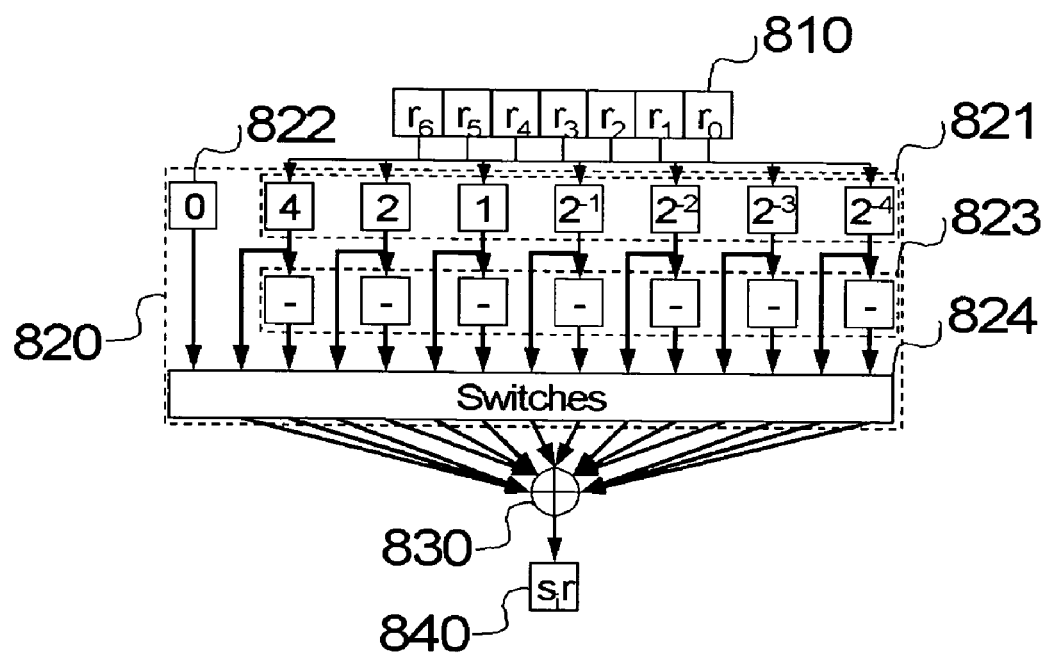
FIG. 8 shows a circuit implementing a multiplier for multiplication of a slope.
Figure 9:
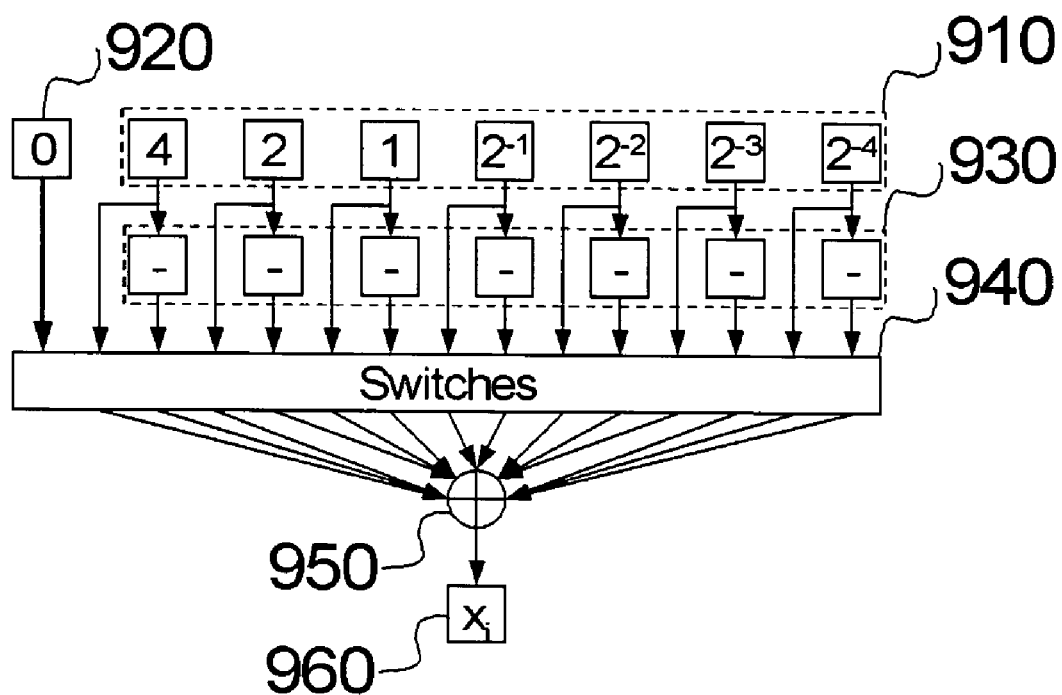
FIG. 9 shows a circuit implementing a summator for summating the boundary values of the respective intervals.

FIG. 7 shows a circuit 700 derived by simplifying the calculator of FIG. 6 through a curtailment of hardware expenses. An input memory 710 has the same function as the input memory 610 of FIG. 6. A summator 740 for summating the boundary values also has the same function as the summator 640 of FIG. 6. A slope calculator and multiplier 730 calculates a slope used for multiplication from the bit of the highest order other than "0" in the input of the input memory, and multiplies the slope value by way of the shifter and the summator to generate an output 840. A boundary calculator 720 calculates a boundary value 960 from the bit of the highest order other than "0" in the input of the input memory. FIG. 8 shows the slope calculator and multiplier 730 of the present invention. Assuming that the leftmost bit is the MSB (Little Endian), an input memory 810 represents the same block as the input memory 710 of FIG. 7. A slope calculator 820 comprises a bit shifter 821, a ground 822 representing "0", a word negater 823, and a switch 824 functioning as a multiplexor. Each bit shifter 821 includes all bit shifters necessary for constructing each slope. The ground 822 represents a value of "0" usable in the slope calculator. The word negater 823 is used for representing the slope. The switches 824 combine the result values from the respective shifters to obtain the final result value. The on/off state of the switches is determined from the value of the slope corresponding to a selected interval of the input value. Thus the hardware resources such as shifters and summators frequently used in the calculation of each slope can be reduced. FIG. 9 shows the boundary calculator 720 of the present invention. The boundary calculator 720 comprises a bit shifter 910, a ground 920 representing "0", a word negater 930, and a switch 940 functioning as a multiplexor. Each bit shifter 910 includes all bit shifters necessary for constructing each boundary value. The ground 920 represents a value of "0" usable in the calculation of the boundary value. The word negater 930 is used for representing the boundary value. The switches 940 combine the result values from the respective shifters to obtain the final result value. The on/off state of the switches is determined from the boundary value corresponding to a selected interval of the input value. Thus the hardware resources such as shifters and summators frequently used in the calculation of each boundary value can be reduced. The connection state of final summators 830 and 950 is predetermined for the most frequent combination of multiplications of binary values in each boundary value, thereby bringing about the expectation of the curtailment of the resources.

While this invention has been described in connection with what is presently considered to be the most practical and preferred embodiment, it is to be understood that the invention is not limited to the disclosed embodiments, but, on the contrary, is intended to cover various modifications and equivalent arrangements included within the spirit and scope of the appended claims.

As described above, the present invention rapidly calculates the parity-check message by sharing the resources of the summator and the shifter, relative to the method of implementing a nonlinear function for calculation of the parity-check message with ROMs. The use of the summator and the shift as a shared resource reduces the required hardware resources more than with the use of a multiplier. The present invention uses the power of 2 as a boundary value of the interval divided for a linear approximation, thereby simplifying the circuits of the slope calculator and the boundary calculator and greatly reducing errors caused by approximation. The method of the present invention can be applied to all the monotonic functions and, particularly, exponentially increasing or decreasing nonlinear functions.

What is claimed is:

1. A message-passing decoder for low-density parity-check (LDPC) codes, which is for decoding block codes encoded with LDPC codes by a message-passing decoding algorithm, the message-passing decoder comprising:
    a log likelihood ratio calculator for receiving a code word having a consecutive value from block codes encoded with the LDPC codes, and calculating a log likelihood ratio;
    a bit node function unit for calculating a bit message using the log likelihood ratio calculated by the log likelihood ratio calculator and an input parity-check message;
    a check node function unit for calculating the parity-check message using the bit message calculated by the bit node function unit, and outputting the calculated parity-check message to the bit node function unit; and
    a parity checker for receiving a code word decoded by the bit node function unit from the final parity-check message calculated by a repeated decoding of the bit node function unit and the check node function unit, and checking a parity,
    wherein the parity-check message corresponding to a logic function output for an input from the bit node function unit is calculated according to a linear approximation function determined for each divided interval of the logic function.

2. The message-passing decoder as claimed in claim 1, wherein the check node function unit comprises:
    a multiplier for multiplying the input from the bit node function unit by a slope of the linear approximation function for each interval;
    a summator for adding a boundary value of the linear approximation function for each interval to an output value of the multiplier; and
    a multiplexor for selecting an output of the summator according to an interval range of the input.

3. The message-passing decoder as claimed in claim 1, wherein the check node function unit comprises:
    a slope calculator for calculating a slope, to be multiplied, from a bit of the highest order other than "0" in the input from the bit node function unit, and multiplying the slope with a bit shifter and a summator;
    a boundary calculator for calculating a boundary value of the linear approximation function for each interval from the bit of the highest order other than "0" in the input; and
    a summator for adding the boundary value calculated by the boundary calculator to an output of the slope calculator.

4. The message-passing decoder as claimed in claim 3, wherein the slope calculator comprises:
    a bit shifter for shifting each bit of the input to the left or right side so as to construct the slope;
    a ground for expressing a value of "0" used in the calculation of the slope;
    a word negater for inverting an output of the bit shifter by each word sign to express the slope; and
    a switch for combining the outputs of the word negater and the ground to output a final result.

5. The message-passing decoder as claimed in claim 4, wherein the boundary calculator comprises:
    a bit shifter for shifting each bit of the input to the left or right side so as to construct the boundary value;
    a ground for expressing a value of "0" used in the calculation of the boundary value;
    a word negater for inverting an output of the bit shifter by each word sign to express the boundary value; and
    a switch for combining the outputs of the word negater and the ground to output a final result.

6. The message-passing decoder as claimed in claims 1, wherein the logic function $\Phi(x)$ satisfies the following equation:

$$\Phi(x) = -\log\left(\tanh\left(\frac{|x|}{2}\right)\right)$$

wherein x is the input from the bit node function unit.

7. The message-passing decoder as claimed in claim 6, wherein the interval $I_i$ of the linear approximation is determined by the following equation:

$$I_i = \lfloor 2^{K+i} 2^{K+1+i} \rfloor, i \in \{0, \ldots, n_1-1\}, K = -n_2$$

wherein $n_1$ is the length of a word expressing the input, i.e., a word length; and $n_2$ is the bit corresponding to a minimum resolution of decimal places expressing the input,
    the boundary value on either side of the interval being the power of 2.

8. The message-passing decoder as claimed in claim 7, wherein the linear approximation function y satisfies the following equation:

$$y = s_i \gamma + x_i, \ i \in \{0, \ldots, |\{I_i\}|-1\}, \ r \in I_i$$

wherein $s_i$ is the slope; and $x_i$ is the boundary value.

9. The message-passing decoder as claimed in claim 8, wherein the slope $s_i$ satisfies the following equation:

$$s_i = \text{ROUND}\left(\frac{\Phi(2^{K+n_1-i-1}) - \Phi(2^{K+n_1-i})}{2^{K+n_1-i-1} - 2^{K+n_1-i}}, n_2\right), \ i \geq 0$$

wherein the ROUND function is a function for designating the input as the most approximate one of binary numbers given by $2^{-n_2}$ as the minimum resolution, the ROUND function satisfying the following equation:

$$\text{ROUND}(x, n_2) = 2^{-n_2}\left\lfloor \frac{x}{2^{-n_2}} + \frac{1}{2} \right\rfloor.$$

10. The message-passing decoder as claimed in claim 9, wherein the boundary value x, satisfies the following equation:

$$x_i = \text{ROUND}((2^{K+n_1-i} - 2^{K+n_1-i+1})s_i + x_{i-1}, n_2), \ i \geq 1,$$

$$x_0 = \text{ROUND}(\Phi(2^{K+n_1}), n_2).$$

* * * * *